United States Patent
Aslam et al.

[11] Patent Number: 6,141,243
[45] Date of Patent: Oct. 31, 2000

[54] SENSOR ELEMENT

[75] Inventors: Amer Aslam; Bedrich Hosticka; Werner Brockherde, all of Duisburg; Michael Schanz, Oberhausen, all of Germany

[73] Assignee: Fraunhofer-Gesellschaft zur Förderung der angewandten Forschung e.V., Munich, Germany

[21] Appl. No.: 09/297,925
[22] PCT Filed: Nov. 12, 1996
[86] PCT No.: PCT/EP96/04947
§ 371 Date: May 14, 1999
§ 102(e) Date: May 14, 1999
[87] PCT Pub. No.: WO98/21756
PCT Pub. Date: May 22, 1998
[51] Int. Cl.[7] .................................................. G11C 16/04
[52] U.S. Cl. .......................... 365/185.01; 365/185.21; 257/239; 257/258
[58] Field of Search ..................... 365/185.01, 185.21; 257/257, 258, 290, 239; 250/208.1

[56] References Cited

U.S. PATENT DOCUMENTS

| | | | |
|---|---|---|---|
| 4,689,808 | 8/1987 | Moorman et al. | 377/60 |
| 4,788,581 | 11/1988 | Knoll et al. | 357/29 |
| 4,885,619 | 12/1989 | Kosai | 357/24 |
| 5,038,214 | 8/1991 | Miida | 358/213.11 |
| 5,057,774 | 10/1991 | Verhelst et al. | 324/158 R |
| 5,142,346 | 8/1992 | Hynecek | 357/50 |
| 5,343,064 | 8/1994 | Spangler et al. | 257/350 |
| 5,541,878 | 7/1996 | LeMoncheck et al. | 365/185.03 |

FOREIGN PATENT DOCUMENTS

| | | |
|---|---|---|
| 40 04 179 | 2/1990 | Germany . |
| 07115182 | 5/1995 | Japan . |

*Primary Examiner*—Richard Elms
*Assistant Examiner*—Hien Nguyen
*Attorney, Agent, or Firm*—Beyer Weaver & Thomas, LLP.

[57] ABSTRACT

A sensor element has a field effect transistor sensitive to a physical quantity to be detected. The gate electrode of the transistor is implemented as a floating gate. The sensor element has therefore integrated therein a sensor cell and a non-volatile memory. The operating point of the transistor can be adjusted permanently by means of the floating gate on which charges can be stored in a non-volatile manner. In addition, charges corresponding to a detected physical quantity can be stored on the floating gate via a simple circuit in a non-volatile manner.

15 Claims, 2 Drawing Sheets

SENSOR ELEMENT

BACKGROUND OF THE INVENTION

1. Field of the Invention

The present invention relates to a monolithic integrated sensor element comprising a field effect transistor which is sensitive to a physical quantity to be detected and a non-volatile memory.

2. Description of the Prior Art

It is known to realize a sensor element and a non-volatile memory by two separate components on a chip. In so doing, e.g. an MOS transistor can act as a sensor and a second MOS transistor can act as a non-volatile memory. Known non-volatile memories of this type are EPROMs, Flash EPROMs, EEPROMs, etc. EEPROMs are frequently used as non-volatile memories in view of their simple programming. An analog storage of information in a single EEPROM cell can increase the storage density and simplify the circuit technologies for analog signal processing when long-term storage is required.

Since in the above-mentioned sensor elements according to the prior art the actual sensor and the non-volatile memory are realized by two transistors, a large chip area is necessary for realizing a sensor element. In addition, due to local parameter variations resulting from the manufacturing process, adaptation problems occur between the two transistors forming a sensor element, whereby a change in the output signal is caused. Furthermore, a signal processing unit is required which processes the sensor signal and the memory contents.

U.S. Pat. No. 4,788,581 relates to an MOS dosimeter used for measuring a dose within a radiation field. The dosimeter comprises a semiconductor substrate, an insulating layer on the semiconductor substrate, the insulating layer being resistant to the radiation and provided with a floating gate. In addition, a metal contact is connected to a semiconductor substrate. The floating gate is used for accumulating a charge, the accumulated charge corresponding to the dose of radiation. The accumulated charge can be reset for using the dosimeter once more.

JP-A-07115182 relates to a photoelectric transducer with a storage function in the case of which a silicon substrate has a layer provided therein into which a source layer and a drain layer have been diffused. A floating gate is arranged on a tunnel oxide film and, in addition, a control gate consisting of polycrystalline silicon is deposited on the floating gate, an oxide film being arranged between these two gates. A photoelectric transducer is formed by the photoconductive layer and a transparent electrode.

Thus there is a need to provide a space-saving sensor element with an associated non-volatile memory, the sensor element avoiding also adaptation problems between the sensor cell and the memory cell caused by local parameter variations resulting from the manufacturing process.

SUMMARY OF THE INVENTION

The present invention is a sensor device having a sensor element in the form of a field effect transistor sensitive to a physical quantity to be detected. The gate electrode of the field effect transistor is implemented as a floating gate. The floating gate is coupled to a programming unit by means of which charges are applied to and removed from the floating gate.

Due to the fact that the gate electrode of the transistor is implemented as a floating gate, the gate electrode can be used for adjusting the operating point of the transistor as well as for storing a charge corresponding to a physical quantity detected by the field effect transistor. For this purpose, the field effect transistor is circuited to a comparator and a propramming unit for the EEPROM, which is defined by the floating gate.

The non-volatile memory defined by the floating gate of the sensor element according to the present invention can be used for adjusting the operating point of the field effect transistor sensitive to a physical quantity to be detected, for storing coefficients for further signal processing, or for storing the detected signal itself. In accordance with a preferred embodiment of the present invention, the field effect transistor sensitive to a physical quantity to be detected is a photosensitive field effect transistor constituting an optical sensor with an integrated, programmable, non-volatile EEPROM memory. The sensor element according to the present invention can be realized in a standard-single-poly-CMOS/EEPROM technology. In addition, the sensor element according to the present invention can also be realized in the double-poly-CMOS/EEPROM technology, whereby the space required for the component can be reduced still further.

In addition to the CMOS technology, also other technologies can be used for realizing the sensor element according to the present invention as long as the operating point of the sensor can be adjusted at a gate terminal. The field effect transistor which is sensitive to a physical quantity to be detected and which constitutes part of the sensor element according to the present invention can, for example, be a CMOS pressure sensor or a CMOS acceleration sensor whose gate electrode is locally displaceable. When the transistor is acted upon by a pressure or by an acceleration, the pressure or the acceleration can be recorded by the local displacement of the gate electrode. When the gate electrode of the pressure sensor or of the acceleration sensor is implemented as a floating gate, a non-volatile memory can be integrated in the sensor.

By means of the present invention, the separation between the sensor and the memory component is eliminated. The sensor includes a floating gate which is capable of storing charges in a non-volatile manner. The charges stored on the floating gate influence the operating point of the sensor. Hence, the operating point can be stored in a non-volatile manner as an analog or as a digital value. It follows that, by means of the present invention, a sensor element is obtained, which includes an analog non-volatile memory in the sensor itself, which can be used for adjusting the operating point, e.g. for offset correction, and also for signal processing.

The realization of the sensor and of the memory in a single component saves a great amount of chip area in comparison with the separate realization according to the prior art, since two components are essentially combined in one. This will not entail additional production costs, since the same production process can be used. Furthermore, deviations between the sensor cell and the memory cell caused by local parameter variations resulting from the manufacturing process are elimniated, since the sensor cell and the memory cell are integrated in one component. In addition, no processing unit processing the sensor signal and the stored value is required. The processing can take place in the sensor element according to the present invention itself. The processing can, for example, be carried out by utilizing the transistor characteristics in the various operating regions of the transistor.

The non-volatile memory of the sensor can also be used for storing the detected sensor signal. For this purpose, a control loop is used for transporting onto the floating gate an amount of charge which is sufficient for the output signal of the sensor to reach a defined value. The sensor signal is then stored in the sensor as a charge variation existing on the floating gate.

In the following, preferred embodiments of the present invention will be explained in detail making reference to the drawings enclosed.

DESCRIPTION OF THE PREFERRED EMBODIMENTS

Figure 1:
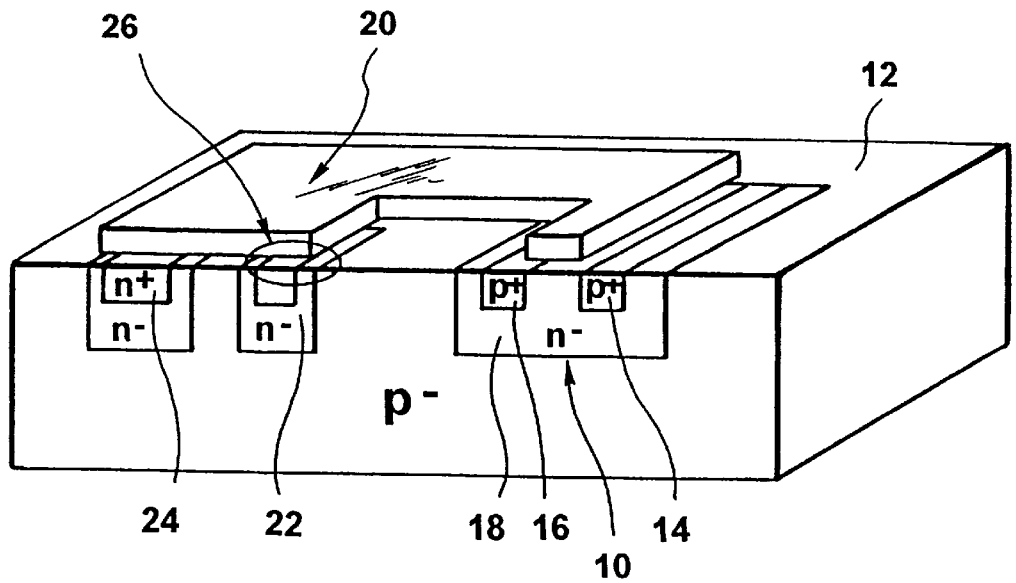
FIG. 1 shows the structural design of a preferred embodiment of a sensor element according to the present invention in a schematic representation.

On the basis of FIG. 1, which shows a preferred embodiment of the present invention in the form of a photosensitive sensor element, the present invention will be explained in detail in the following.

A photo-field effect transistor 10 is formed in a substrate 12. The photo-field effect transistor is a p-channel MOS transistor whose $p^+$-doped source 14 and whose $p^+$-doped drain 16 are located in a floating n-well 18. Instead of a normal gate, a floating gate 20 is located above the p-channel of the transistor, the floating gate 20 being capable of storing charges in a non-volatile manner. The floating gate 20 is implemented such that a section thereof is arranged above n-doped regions in the p-substrate 12. A first n-doped region 22 serves as an injection region, whereas a second n-doped region 24 serves as a control region. The floating gate 20 and the injection region 22 are arranged in opposed relationship with one another in such a way that a tunnel region 26 is formed therebetween.

When light waves impinge on the sensor element, the photoeffect will cause electrons to accumulate in the n-well of the transistor 10, whereby the threshold voltage of the PMOS transistor will be displaced. The threshold voltage $V_{th}$ shows an almost logarithmic dependence on the incident light intensity. The threshold voltage $V_{th}$ additionally depends on charges which may perhaps exist on the floating gate. The threshold voltage $V_{th}$ can, for example, be defined as the gate voltage causing a drain current of 10 $\mu$A at a drain-source voltage of 2 volts.

Due to the fact that the threshold voltage can be displaced by charges existing on the floating gate, a simple non-volatile offset correction or operating point adjustment of the photosensitive sensor is possible.

Figure 2:
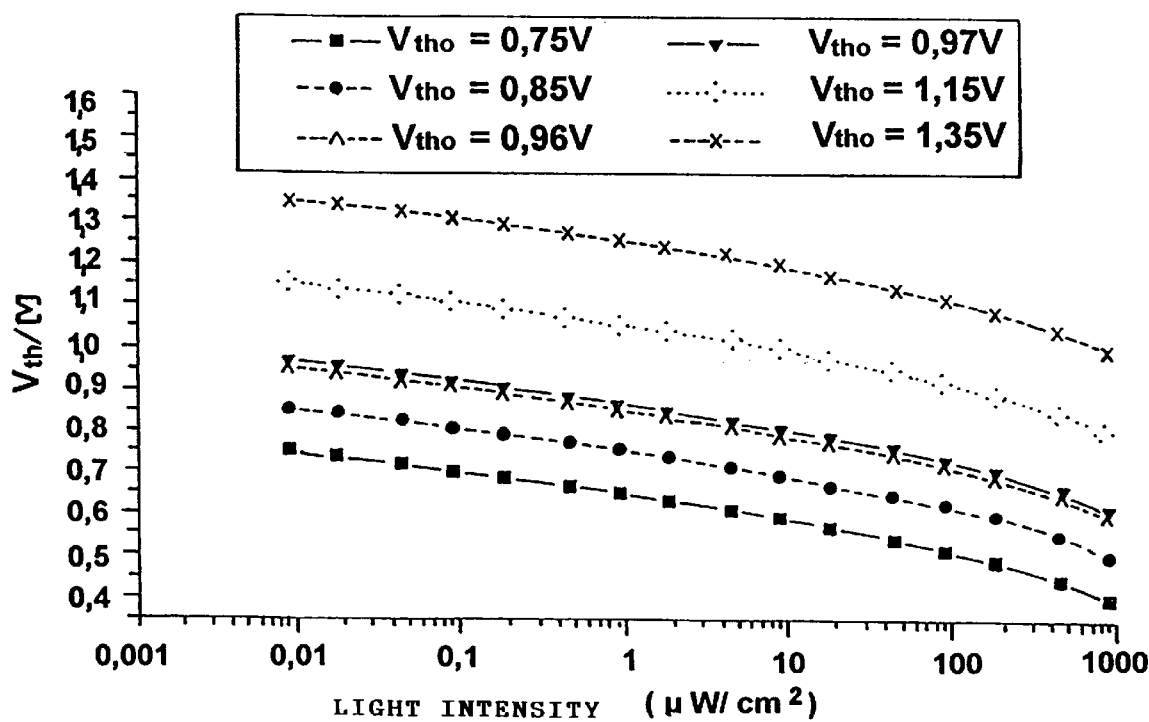
FIG. 2 shows a representation of the optical characteristics of the sensor element shown in FIG. 1 in the case of different preprogrammed threshold voltages.

FIG. 2 shows optical characteristics of the sensor element shown in FIG. 1 at various preprogrammed threshold voltages of the sensor transistor. These threshold voltages can be programmed by moving electrons towards the floating gate 20 or by removing them from the floating gate 20 by applying a high voltage between the control region 24 and the injection region 22. This is realized by means of a tunnel effect between the injection region 22 and the section of the floating gate 20 arranged above the injection region 22.

FIG. 2 shows the optical characteristics of the sensor logarithmically for voltages $V_{tho}$ in the range 0.75 volts to 1.35 volts, $V_{tho}$ standing for the threshold voltage $V_{tho}$ without incident light. As can be seen in FIG. 2, the programmed threshold voltages do not change the logarithmic dependence of the characteristic of the sensor on the incident light intensity.

Figure 3:
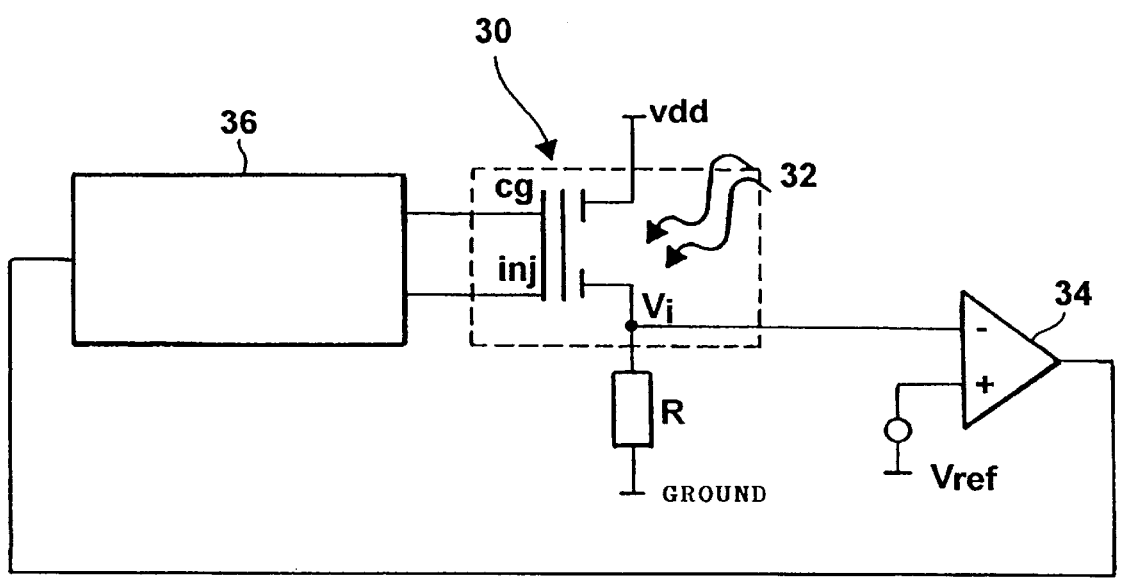
FIG. 3 shows a schematic representation of a control loop for storing the sensor signal in the sensor memory.

FIG. 3 shows a control loop permitting a charge, which corresponds to an optical signal, to be stored on the floating gate in a simple manner. In the broken marking line 30 the graphical symbol of the photo-field effect transistor with integrated EEPROM memory is shown, the photo-field effect transistor representing the sensor element according to the preferred embodiment of the present invention. This sensor element is acted upon by incident light 32. The source electrode of the transistor has a supply voltage vdd applied thereto. The drain electrode of the transistor is connected to ground via a resistor R. The drain electrode is additionally connected to a first input of a comparator 34. The second input of the comparator is connected to a voltage source which applies a reference voltage $V_{ref}$ thereto. The output of the comparator is connected to a programming unit 36 for the EEPROM of the photo-field effect transistor. The programming unit 36 is connected to the control region 24 and the injection region 22.

The reference voltage $V_{ref}$ corresponds to the output voltage $V_i$ when there is no incident light 32. When the transistor is acted upon by incident light 32, the threshold voltage of the transistor will be displaced and this will cause a change in the output voltage $V_i$. This change is detected by the comparator 34, whereupon charges will be applied to the floating gate by the programming unit 36 until the output voltage $V_i$ has reached the reference voltage $V_{ref}$. When this reference voltage has been reached, the threshold voltage of the PMOS transistor, which has been changed by the incident light 32, is compensated for by the charges on the floating gate which cause a threshold voltage displacement. It follows that a voltage corresponding to the light power is stored as a threshold voltage change on the floating gate in the sensor.

Hence, the present invention provides a monolithic integrated sensor element in the case of which parameter variations resulting from the manufacturing process and also adaptations to changed environmental conditions can be compensated for by a non-volatile memory integrated in the sensor element. The compensation information is stored on the floating gate. In addition, the memories according to the present invention can easily be used as analog memories, since they are capable of processing the analog signal of the sensor directly or of storing permanently an analog operating point voltage to be programmed. The component according to the present invention contains simultaneously a sensor element and a non-volatile memory.

The sensor element according to the present invention can be used for numerous applications, e.g. in the field of neural networks with non-volatile mass memories or in the field of learning cameras which can learn image patterns only by "viewing". The non-volatile storage possibility also permits a displacement and sensitivity correction of the sensor so that a fixed pattern noise in large photosensor arrays can be eliminated.

What is claimed is:

1. A sensor device comprising a sensor element in the form of a field effect transistor sensitive to a physical quantity to be detected, the gate electrode of said field effect transistor being implemented as a floating gate;

wherein a change of the threshold voltage of the field effect transistor in dependence upon the physical quantity detected is compensated by means of a programming unit by means of which charges are applied to and removed from said floating gate, whereby a threshold voltage change corresponding to the physical quantity is stored on the floating gate in the form of these charges.

2. A sensor element according to claim 1, wherein the field effect transistor is a photosensitive field effect transistor.

3. A sensor element according to claim 1, wherein the field effect transistor is a sensor which is sensitive to pressure or acceleration and which has a locally displaceable floating gate.

4. A sensor element according to claim 1, wherein the floating gate is adapted to be acted upon by charges through a tunnel effect.

5. A sensor element according to claim 4, wherein the field effect transistor is formed in a substrate, and that the floating gate is implemented such that one section of the floating gate is located opposite a heavily doped region arranged in said substrate, in such a way that a tunnel region is formed between said heavily doped region and said section of the floating gate.

6. A sensor element according to claim 1, wherein the source electrode of the field effect transistor is connected to a voltage source and that the drain electrode of the field effect transistor is connected via a resistor to ground and, in addition, directly to a first input of a comparator, a second input of said comparator being connected to a reference voltage source and the output of said comparator being connected to the programming unit.

7. In a sensor device a method of storing a charge corresponding to a physical quantity to be detected, said method comprising:
  applying a physical quantity to be detected to a sensor element in the form of a field effect transistor, wherein the gate electrode of said field effect transistor is implemented as a floating gate which is coupled to a programming unit by means of which charges are applied to and removed from the floating gate, wherein the source electrode of said field effect transistor is connected to a voltage source and the drain electrode of said field effect transistor is connected via a resistor to ground and directly to a first input of a comparator, wherein a second input of said comparator is connected to a reference voltage source, and wherein the output of said comparator is connected to said programming unit; and
  applying charges to the floating gate by means of said programming unit until the voltage applied to the first input of said comparator corresponds to the reference voltage applied to the second input of said comparator.

8. A sensor device comprising
  a sensor element in the form of a field effect transistor sensitive to a physical quantity to be detected, the gate electrode of said field effect transistor being implemented as a floating gate;
  wherein the threshold voltage of the field effect transistor is adjusted by means of a programming unit by means of which charges are applied to and removed from said floating gate.

9. A sensor element according to claim 8, wherein the field effect transistor is a photosensitive field effect transistor.

10. A sensor element according to claim 8, wherein the field effect transistor is a sensor which is sensitive to pressure or acceleration and which has a locally displaceable floating gate.

11. A sensor element according to claim 8, wherein the floating gate is adapted to be acted upon by charges through a tunnel effect.

12. A sensor element according to claim 11, wherein the field effect transistor is formed in a substrate, and wherein the floating gate is implemented such that one section of the floating gate is located opposite a heavily doped region arranged in said substrate in such a way that a tunnel region is formed between said heavily doped region and said section of the floating gate.

13. A sensor element according to claim 8, wherein the source electrode of the field effect transistor is connected to a voltage source, and wherein the drain electrode of the field effect transistor is connected via a resistor to ground and directly to a first input of a comparator, and wherein a second input of said comparator is connected to a reference voltage source, and wherein the output of said comparator is connected to the programming unit.

14. A sensor device comprising
  a sensor element in the form of a field effect transistor sensitive to a physical quantity to be detected, the gate electrode of said field effect transistor being implemented as a floating gate;
  wherein the floating gate is coupled to a programming unit by means of which charges are applied to and removed from said floating gate;
  wherein the floating gate is adapted to be acted upon by charges through a tunnel effect; and
  wherein the field effect transistor is formed in a substrate, and wherein the floating gate is implemented such that one section of the floating gate is located opposite a heavily doped region arranged in said substrate in such a way that a tunnel region is formed between said heavily doped region and said section of the floating gate.

15. A sensor device comprising
  a sensor element in the form of a field effect transistor sensitive to a physical quantity to be detected, the gate electrode of said field effect transistor being implemented as a floating gate;
  wherein the floating gate is coupled to a programming unit by means of which charges are applied to and removed from said floating gate; and
  wherein the source electrode of the field effect transistor is connected to a voltage source, and wherein the drain electrode of the field effect transistor is connected via a resistor to ground and directly to a first input of a comparator, and wherein a second input of said comparator is connected to a reference voltage source, and wherein the output of said comparator is connected to the programming unit.

* * * * *